US010734996B2

(12) United States Patent
Nagel et al.

(10) Patent No.: US 10,734,996 B2
(45) Date of Patent: Aug. 4, 2020

(54) SENSOR APPARATUS FOR DETECTING A TARGET OBJECT AND A METHOD FOR OPERATING A SENSOR APPARATUS FOR DETECTING A TARGET OBJECT

(71) Applicant: BALLUFF GmbH, Neuhausen (DE)

(72) Inventors: Joachim Nagel, Tübingen (DE); Michael Friedrich, Wolfschlugen (DE); Michael Grandl, Esslingen (DE); Ümit Koyuncu, Ostfildern (DE)

(73) Assignee: BALLUFF GmbH, Neuhausen (DE)

( * ) Notice: Subject to any disclaimer, the term of this patent is extended or adjusted under 35 U.S.C. 154(b) by 177 days.

(21) Appl. No.: 15/903,170

(22) Filed: Feb. 23, 2018

(65) Prior Publication Data

US 2018/0375516 A1 Dec. 27, 2018

Related U.S. Application Data

(63) Continuation of application No. PCT/EP2015/070842, filed on Sep. 11, 2015.

(51) Int. Cl.
*H03K 17/95* (2006.01)
*G01N 27/02* (2006.01)
*G01V 3/10* (2006.01)

(52) U.S. Cl.
CPC ....... *H03K 17/9525* (2013.01); *G01N 27/028* (2013.01); *G01V 3/105* (2013.01)

(58) Field of Classification Search
CPC ... G01N 27/028; G01V 3/105; H03K 17/9525
See application file for complete search history.

(56) References Cited

U.S. PATENT DOCUMENTS

| | | | |
|---|---|---|---|
| 4,709,213 A | | 11/1987 | Podhrasky |
| 4,710,708 A | * | 12/1987 | Rorden ............. E21B 47/02224 |
| | | | 324/207.26 |
| 4,821,023 A | * | 4/1989 | Parks ..................... G01V 3/107 |
| | | | 340/516 |

(Continued)

FOREIGN PATENT DOCUMENTS

| | | |
|---|---|---|
| DE | 102013209808 | 11/2014 |
| EP | 2312338 | 4/2011 |

(Continued)

*Primary Examiner* — Reena Aurora
(74) *Attorney, Agent, or Firm* — Lipsitz & McAllister, LLC

(57) ABSTRACT

A sensor apparatus for detecting a target object is provided, together with a corresponding method for operating the sensor apparatus. The sensor apparatus comprises a transmitter device which is operated by periodic excitation signals at a basic frequency, a receiver device which couples to the transmitter device, wherein the coupling is dependent on a relative position of the target object with respect to the receiver device, and the receiver device delivers signals at the basic frequency which are dependent on the relative position of the target object with respect to the receiver device. A threshold value checking device checks whether signals lie within or outside a threshold value range. A linking device acts on signals from the receiver device or signals derived therefrom in such a way that signals or signal combinations are shifted into the threshold value range insofar as they previously lay outside this range.

29 Claims, 15 Drawing Sheets

(56) References Cited

U.S. PATENT DOCUMENTS

| | | | |
|---|---|---|---|
| 5,729,143 | A | 3/1998 | Tavemetti et al. |
| 7,432,715 | B2 | 10/2008 | Stamatescu |
| 2011/0089938 | A1 | 4/2011 | Schmidt |
| 2015/0247945 | A1 | 9/2015 | Reime |
| 2016/0274060 | A1* | 9/2016 | Denenberg ......... G01N 27/9046 |
| 2017/0003144 | A1 | 1/2017 | Reime |

FOREIGN PATENT DOCUMENTS

| | | |
|---|---|---|
| WO | 2013119741 | 8/2013 |
| WO | 2014053240 | 4/2014 |
| WO | 2015090609 | 6/2015 |

* cited by examiner

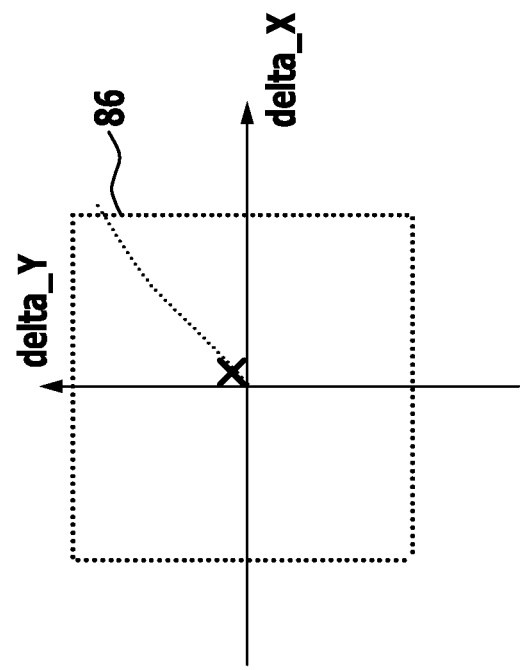
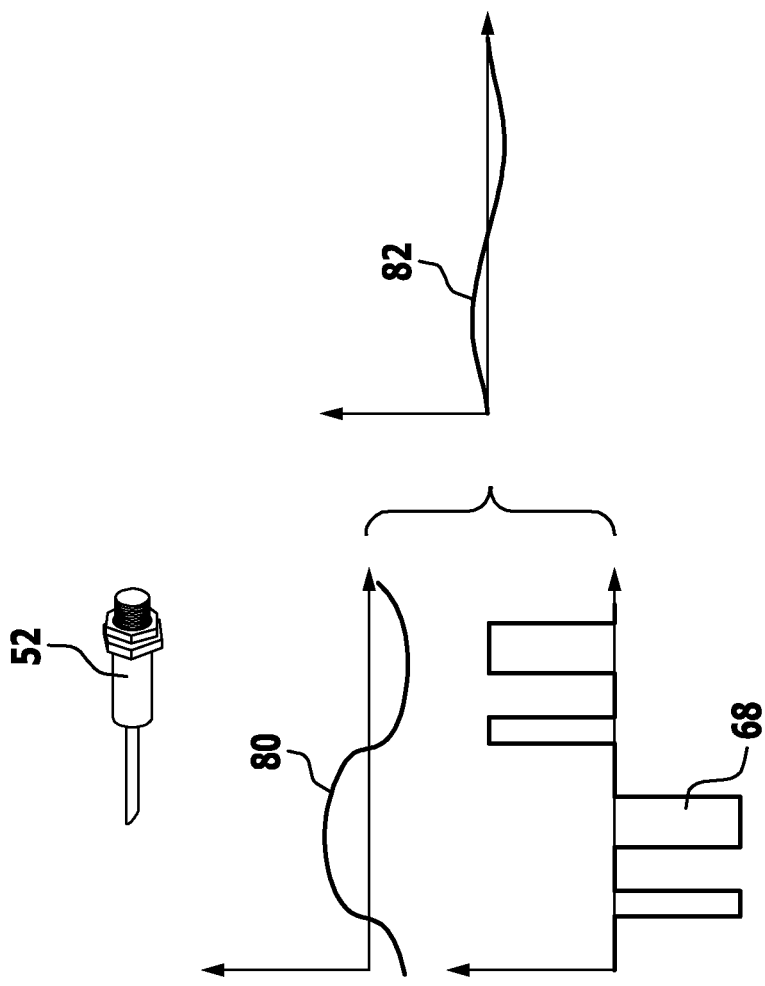
FIG.7(a) FIG.7(b) FIG.7(c)

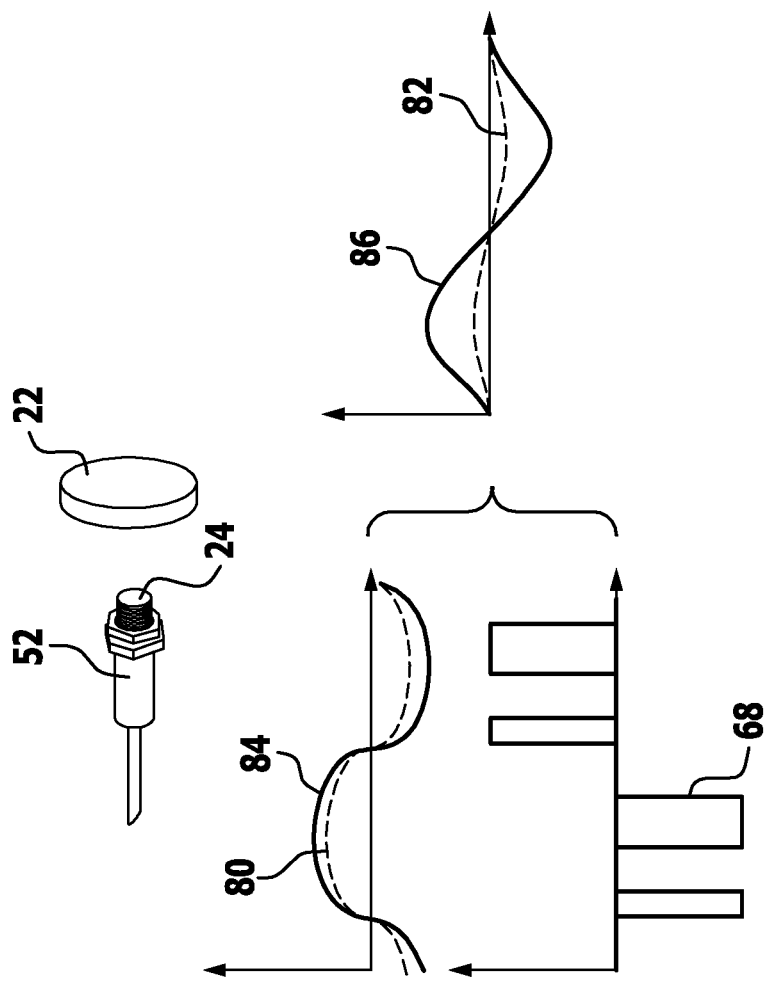
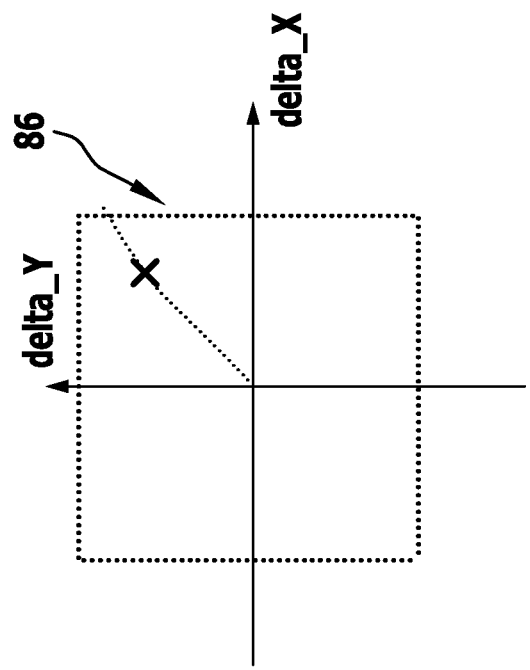
FIG.9(a)  FIG.9(b)  FIG.9(c)

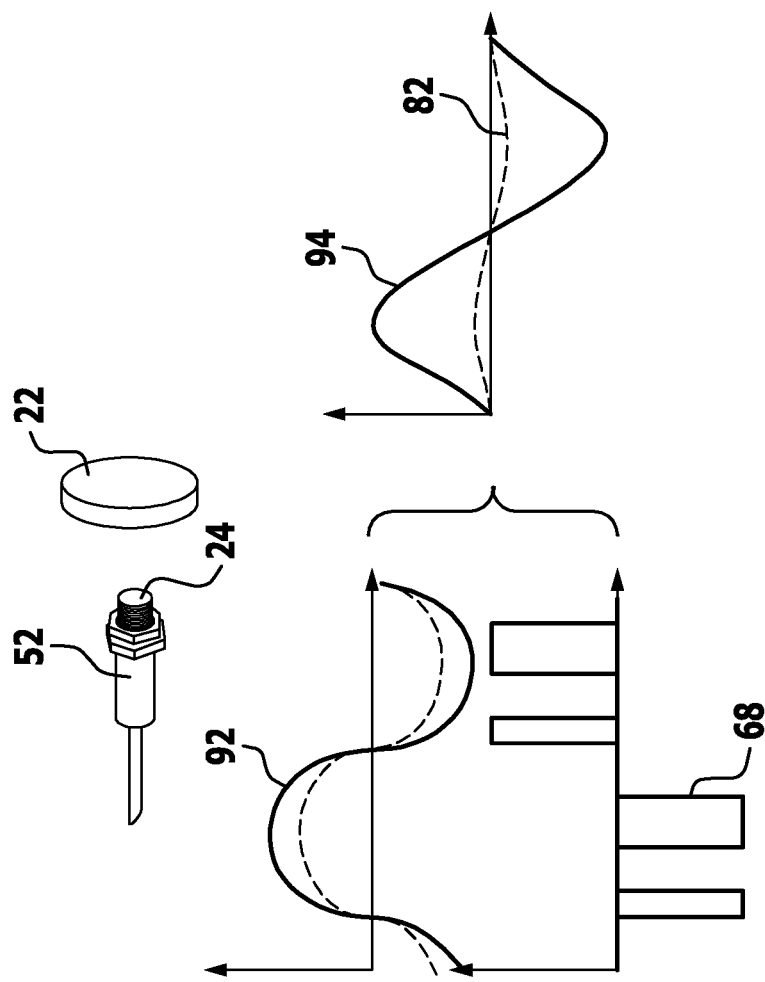
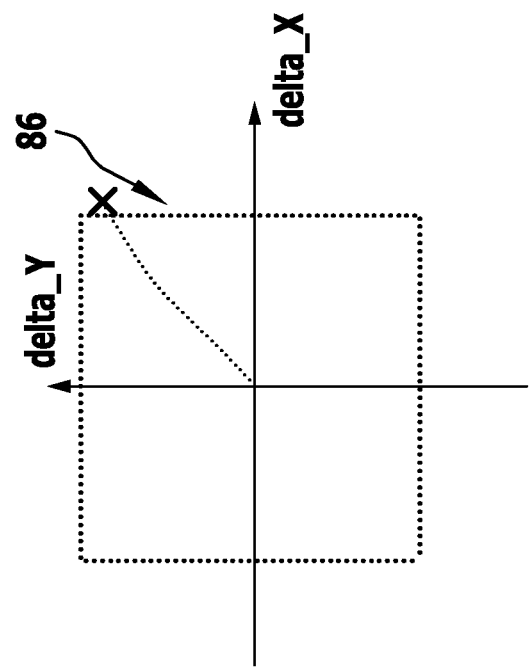
FIG.11(a)　FIG.11(b)　FIG.11(c)

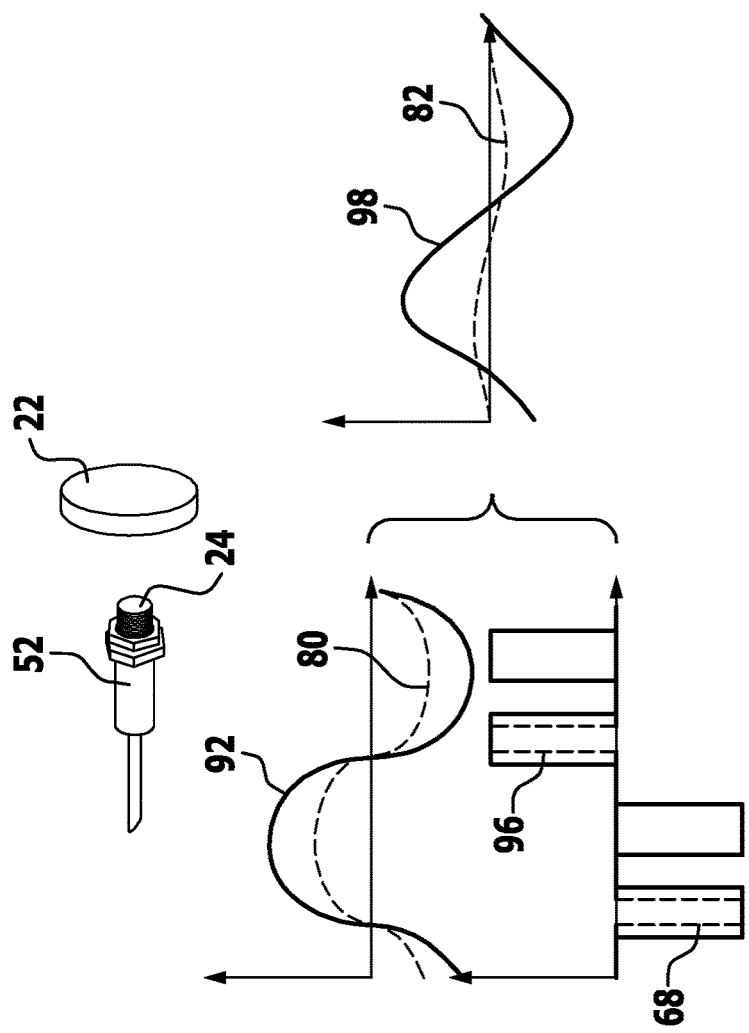
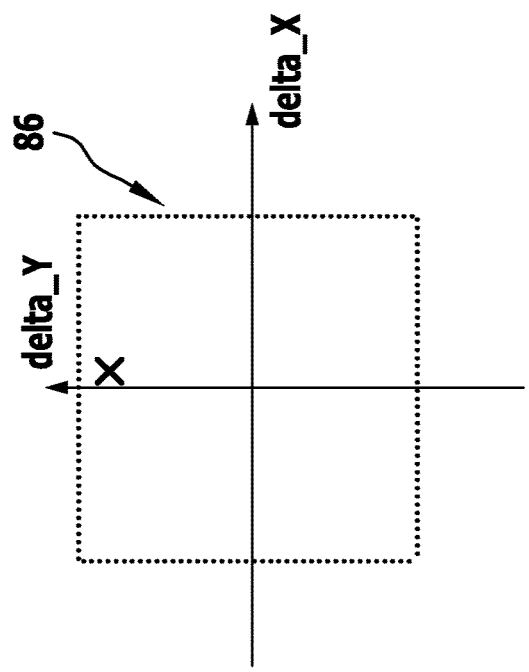
FIG.12(a)  FIG.12(b)  FIG.12(c)

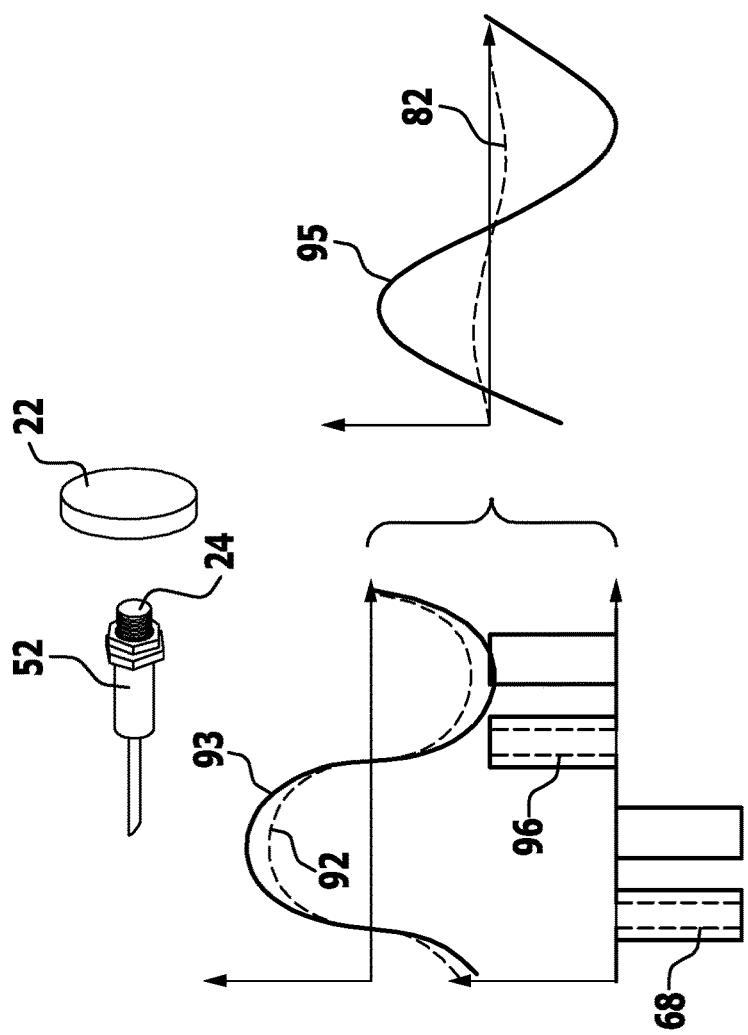
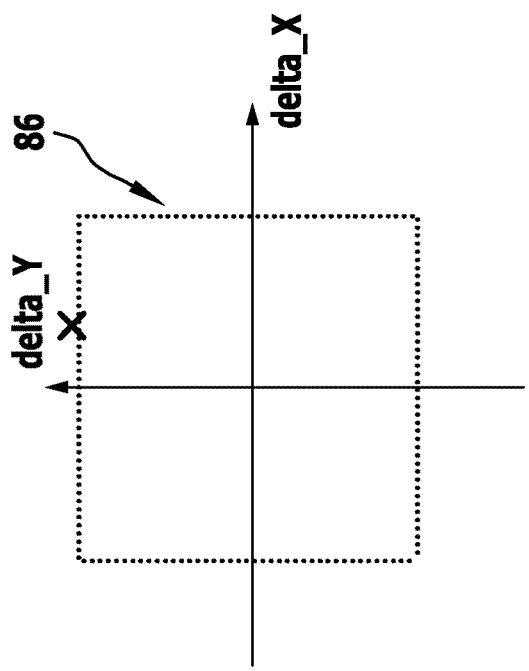
FIG.13(a) FIG.13(b) FIG.13(c)

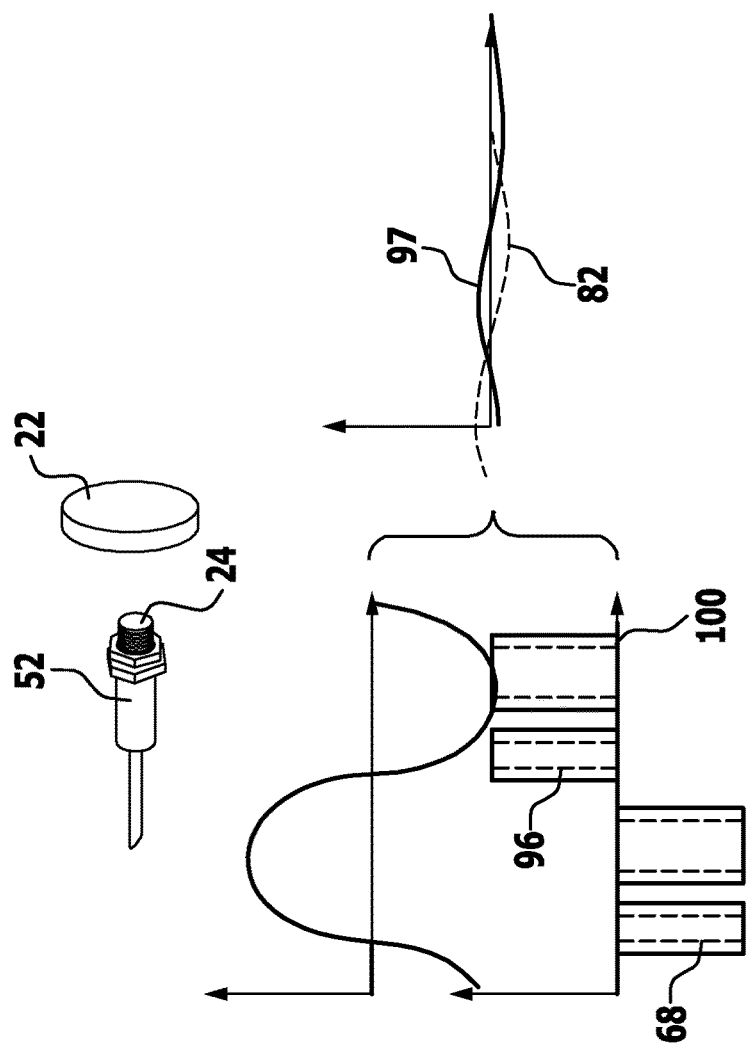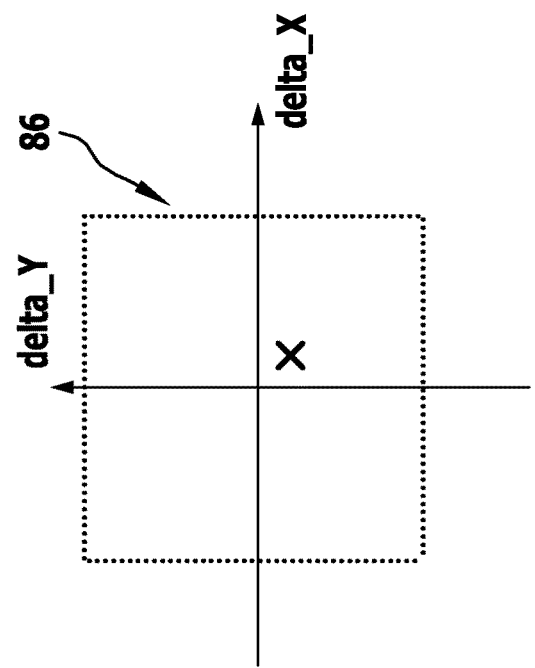
FIG. 14(a)   FIG. 14(b)   FIG. 14(c)

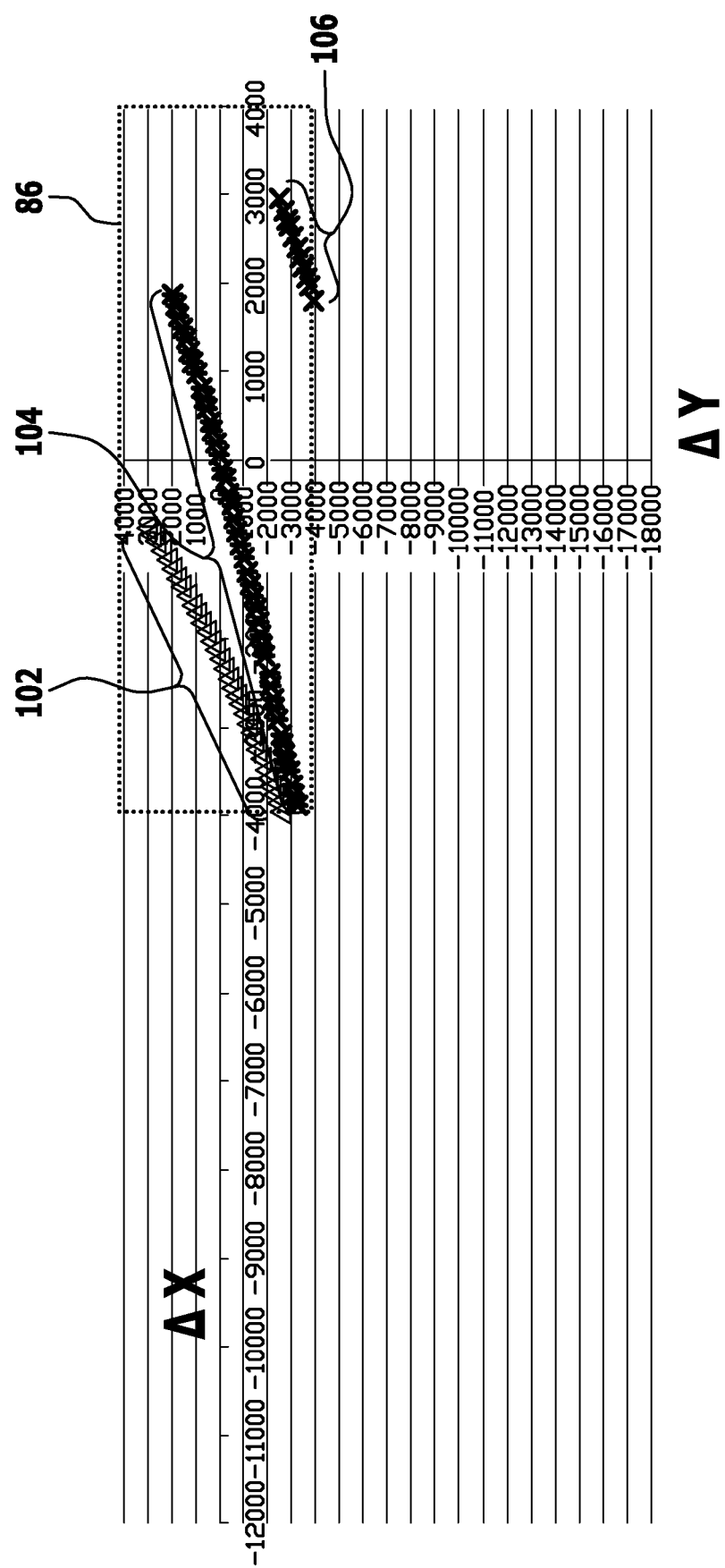

SENSOR APPARATUS FOR DETECTING A TARGET OBJECT AND A METHOD FOR OPERATING A SENSOR APPARATUS FOR DETECTING A TARGET OBJECT

This application is a continuation of international application number PCT/EP2015/070842 filed on Sep. 11, 2015, which is incorporated herein by reference in its entirety and for all purposes.

BACKGROUND OF THE INVENTION

The invention relates to a sensor apparatus for detecting a target object.

Furthermore, the invention relates to a method for operating a sensor apparatus for detecting a target object.

From WO 2014/053240 A2, there is known a method for locating and/or detecting metallic or metal-containing objects and materials, wherein a coil arrangement is provided in which a transmission coil and a receiving coil are arranged one above the other. A closed combination system for regulating a receiving-coil output signal is provided in the receiving coil for compensating changes occurring within the detection range of the receiving coil which affect the receiving coil.

From WO 2015/090609 A1, there is known a sensor arrangement for the determination of at least one physical parameter by means of a sensor unit.

SUMMARY OF THE INVENTION

In accordance with an embodiment of the invention, a sensor apparatus is provided which permits a large dynamic measuring range at high resolution.

In accordance with the invention, there is provided
a transmitter device which is operated by periodic excitation signals at a basic frequency,
a receiver device which couples to the transmitter device, wherein the coupling is dependent on a relative position of the target object with respect to the receiver device, wherein the receiver device delivers signals at the basic frequency which are dependent on the relative position of the target object with respect to the receiver device,
an amplifier which is connected downstream of the receiver device,
a signal evaluating device which is connected downstream of the amplifier,
a threshold value checking device which checks whether signals or signal combinations of such signals that are delivered by the signal evaluating device lie within or outside a threshold value range or whether the signals delivered to the amplifier lie within or outside a threshold value range, and
a linking device which acts on signals from the receiver device or signals derived therefrom in such a way that signals or signal combinations of such signals which are delivered by the signal evaluating device are shifted into the threshold value range if they were previously outside it, or that signals which are delivered to the amplifier are shifted into the threshold value range if they were previously outside it.

In accordance with the invention, a signal evaluating process can be carried out without zero-regulation of the corresponding signals. Problems which develop in the course of a regulation process such as a maximum switching frequency of the sensor apparatus that is limited by a finite speed of regulation and which can lead to a slowing down of the system are avoided.

When using a microcontroller in a regulating process for realizing a high resolution and a high speed of regulation, great demands are made on its performance specifications. This leads to a high power consumption on the one hand and usually to large constructional dimensions of the microcontroller. Besides, such microcontrollers are also associated with relatively high costs.

In principle, the problem arises that input signals can exhibit large amplitudes in dependence on the relative position of the target object and the amplifier is operated in a saturation mode and thus "signal distortion" occurs so that a signal measurement which characterizes the relative spacing of the target object to the receiver device is no longer possible.

In the solution in accordance with the invention, the linking device ensures that signals are as it were shifted into the threshold value range in such a way that a corresponding process of evaluation is possible.

The threshold value range is selected in such a way that the amplifier and/or the signal evaluating device are not operated in the saturation region thereof. Hereby, a check is made by the threshold value checking device as to whether such a shift is required and carries out this process if necessary.

A dynamic extension of the measuring range can then be achieved without the abovementioned disadvantages of the zero point regulation process arising or becoming noticeable. The resolution of the target object evaluation process is thereby retained over the entire measuring range.

For example, the signal evaluating device can then be realized by means of an analogue-digital converter or by means of a comparator.

In principle, a periodic excitation signal having differing frequencies could also be produced. The corresponding evaluation process in the apparatus in accordance with the invention then functions, in principle, for each frequency in the same way as for the basic frequency.

The receiver device delivers a signal which is then supplied to the amplifier. Before being supplied to the amplifier, this signal can be processed such as by being subjected to a pre-amplification process for example or the signal is supplied to an impedance converter.

In one embodiment, the receiver device is formed in such a way that, without the influence of a target object, it furnishes at least approximately zero-signals. The goal is that the receiver device furnish zero-signals. For example, due to the fact that the receiver device is installed in a housing (such as a metallic housing), then the provision of an exactly zero signal is not in practice realizable. In this case for example, a compensation signal can be superimposed in order to bring the signal into the threshold value range. The compensation signal could also be produced or coupled in by the linking device for example.

It is expedient if the linking device adds (with a negative prefix sign) compensation signals and/or overlay signals to the signals of the receiver device and signals derived therefrom in order to cause a shift into the threshold value range. In particular, a previously fixed voltage level is subtracted (added with a minus prefix sign). A shift into the threshold value range can then be achieved in a simple manner, wherein this process of shifting into the threshold value range is not a regulating process which is afflicted with the corresponding disadvantages.

In particular the threshold value range is a voltage range.

It is especially particularly advantageous if the linking device subtracts a certain voltage level from the signals from the receiver device or from signals derived therefrom. A shift into the threshold value range can thereby be achieved in a simple manner and in particular, without having to go through a regulating process. This thereby results in a dynamic extension of the measuring range.

In particular, the threshold value range is selected in such a way that the amplifier works in a defined amplification mode for input signals of the amplifier. The threshold value range is selected in such a way as to ensure that the amplifier does not operate in a saturation state for corresponding input signals.

In one exemplary embodiment, the signal evaluating device comprises an analogue-digital converter or is such a converter and/or is a comparator or comprises such a comparator. A high resolution can thereby be obtained.

It is likewise expedient if the threshold value range is then selected in such a way that the analogue-digital converter or the comparator works in a defined converter mode or comparator mode for input signals of the analogue-digital converter or the comparator. It is thereby ensured that the analogue-digital converter or the comparator is operated in a suitable operating range.

It is expedient if a filter for the basic frequency is provided, said filter being arranged between the signal evaluating device and the receiver device, wherein, in particular, a logical interface of the linking device is connected upstream of the filter. The filter is a bandpass filter having the basic frequency as its centre frequency for example. It is thereby ensured that it is only such components as oscillate at the basic frequency that are taken into consideration for the evaluation process. If the logical interface is connected before the filter, then signals at other frequencies are filtered out.

It is especially particularly advantageous if the signal evaluating device detects certain signal values in synchronism with the excitation signals. The evaluation process can then be carried out utilising these values in order to determine the position of the target object relative to the receiver device.

For example, certain signal values determined by the signal evaluating device within one or more periods differ in phase, wherein, in particular, at least two successive signal values are determined: a signal value $V_1$ at the phase position $\delta+0°$, a signal value $V2$ at the phase position $\delta+90°$, $V3$ at the phase position $\delta+180°$, a signal value $V4$ at the phase position $\delta+270°$, wherein $\delta$ is a shift value. In particular, the shift value $\delta$ is selected in such a way that interference with the corresponding measured values by the flanks of the exciting signal is prevented. Thus, "in phase signals" and "out of phase signals" can be detected in this way. The evaluation process can be carried out and optimized thereby.

In particular, a target object evaluation device is provided for evaluating the signal values of the signal evaluating device for the purposes of determining the relative position of the target object, wherein the target object evaluation device evaluates differences of signal values in particular, whereby, in particular, delta_$X=V_1-V_3$ and delta_$Y=V_2-V_4$ are formed. The position can be determined directly from these values.

It is especially particularly advantageous if differences formed by the target object evaluation device are evaluated without a zero-regulation process. The problems such as a finite speed of regulation and a high computing time which arise when using a regulating process can thus be avoided.

Furthermore, a high resolution can be achieved by simple means such as an analogue-digital converter for example. "Conventional" microcontrollers can be used.

It is especially particularly advantageous if the target object evaluation device takes into consideration signals from the linking device during the target object evaluation process. It can thereby be taken into consideration as to whether shifts were carried out just once or several times. It can thereby be detected as to whether a dynamic extension of the measuring range by means of overlay signals of the linking device took place and this can then be taken into consideration during the evaluation process.

It is especially particularly advantageous if the linking device comprises a signal generating device which delivers overlay signals that are combined with signals from the receiver device or with signals that are derived therefrom. Signals can thus be supplied to the amplifier such as to ensure that signals that lie within the threshold value range will result in the evaluation system. A dynamic extension of the measuring range can thereby be obtained. A regulating process with its attendant disadvantages does not have to be carried out.

For example, the signal generating device is a pulse width modulation device or comprises such a device. This delivers corresponding signals which are logically combined with signals from the receiver device (or with signals derived therefrom) before the resultant combination signal is supplied to the amplifier.

It is expedient if the overlay signals are generated in synchronism with the excitation signals. This thereby enables a phase-correct superimposition process to be effected.

In one exemplary embodiment, the pulse width modulation device comprises respective pulse width modulators which are provided for the different phase positions. For example, two pulse width modulators or four pulse width modulators are provided.

It is especially particularly advantageous if the transmitter device is arranged symmetrically with respect to the receiver device, wherein in particular, the transmitter device and the receiver device are arranged in a common housing. The result can then be achieved that, without the influence of a target object, the signals of the receiver device, which the latter delivered directly, are at least approximately zero-signals. At most, effects of the housing or the like cause a deviation from the zero-signal. A simple compensation process can be carried out in order to obtain a zero-signal.

In one exemplary embodiment, the receiver device comprises a first part and a second part, wherein the first part is arranged and/or formed anti-symmetrically with respect to the second part and the signals of the receiver device are formed by superimposing the signals of the first part and the second part. Hereby, the superimposition process does not have to be effected by deliberately superimposing the signals, but it could also be regarded as being the result of the arrangement of the first part and the second part.

In one exemplary embodiment, the transmitter device comprises at least one coil. The receiver device comprises at least one coil.

In particular, the receiver device couples inductively to the transmitter device and the target object consists of a metallic material. The metallic material as well as the position of the target object affect the inductive coupling.

It is expedient if the linking device provides compensation signals which bring the signals of the receiver device or signals derived therefrom into the threshold value range without the influence of a target object. In the general case, if the linking device delivers the overlay signals, then compensation signals and also overlay signals are delivered to the signals of the receiver device. The overlay signals serve for dynamically extending the measuring range.

In particular, the sensor apparatus is in the form of a proximity sensing apparatus by means of which the spacing of the target object to the receiver device and/or an approach of the target object to the receiver device and/or a movement of the target object away from the receiver device are detectable. In principle thereby, absolute magnitudes can be determined, or the proximity sensing apparatus is in the form of a switch which generates a switching signal when a certain switching distance is reached.

In accordance with an embodiment of the invention, there is provided a method for operating a sensor apparatus for detecting a target object wherein
 a transmitter device is operated by periodic excitation signals of a certain basic frequency,
 signals of a receiver device which exhibit the basic frequency are evaluated, wherein the receiver device is coupled to the transmitter device, and the coupling and thus too the signals of the receiver device are dependent on a relative position of the target object to the receiver device,
 signals of the receiver device or signals derived therefrom are amplified and these signals are evaluated in synchronism with the excitation signal,
 a check is made as to whether the evaluated signals or signal combination thereof or whether signals supplied to an amplifier for amplification purposes do or do not lie within a threshold value range, and, if is detected that the evaluated signals lie outside of the threshold value range, or if it is detected that the signals supplied to the amplifier lie outside of the threshold value range then overlay signals are generated which are superimposed on signals of the receiver device or signals derived therefrom, wherein the overlay signals are selected in such a way that the resulting evaluated signals or signal combinations thereof lie within the threshold value range or signals supplied to the amplifier lie within the threshold value range.

The method in accordance with the invention exhibits the advantages already described in connection with the sensor apparatus in accordance with the invention.

The dynamic extension of the measuring range ensuing from the method in accordance with the invention permits a high resolution over the entire measuring range.

The method in accordance with the invention can be carried out by the sensor apparatus in accordance with the invention or the sensor apparatus in accordance with the invention can be operated using the method in accordance with the invention.

In particular, evaluated signals or signal combinations of such signals which lie within the threshold value range are used for determining the position of the target object relative to the receiver device, wherein a determination is made as to whether and how often a shift into the threshold value range has been effected by the superimposition process. The dynamic extension of the measured value range with high resolution can be obtained thereby.

In accordance with the invention, the target object determination process is carried out without zero-regulation of the evaluated signals. The disadvantages of a regulating process can thereby be avoided.

In particular, compensation signals are superimposed on signals from the receiver device or on signals derived therefrom, wherein said compensation signals are selected in such a way that, without the influence of a target object, signals which are supplied as input signals to a signal evaluating device or to the amplifier for amplification purposes lie within the threshold value range without the influence of a target object. This thereby results in a highly accurate measuring process.

BRIEF DESCRIPTION OF THE DRAWINGS

The following description of preferred embodiments serves to provide a more detailed explanation of the invention when taken in conjunction with the drawings. Therein:

FIG. 6 (b) a similar illustration when a target object is present;

FIG. 6 (c) the same illustration as FIG. 6 (b) with compensation and superimposition of an overlay signal;

FIGS. 7 (a), (b), (c) signals when a target object is not present, and a corresponding position of signals evaluated from signal combinations within a threshold value range;

FIGS. 9 (a), (b), (c) the situation as in FIGS. 8 (a) to (c) when a target object is present;

FIGS. 11 (a), (b), (c) the same situation as in FIGS. 10 (a) to (c) when the target object is still closer to the receiver device and the threshold value range is exceeded;

FIGS. 12 (a), (b), (c) when, on the basis of the situation in accordance with FIGS. 11 (a) to (c), a shift into the threshold value range has been carried out by means of an overlay signal;

FIGS. 13 (a), (b), (c) a further situation in the presence of a target object, wherein a threshold value range is exceeded;

FIGS. 14 (a), (b), (c) the same situation as in FIG. 13, wherein there has been a shift into the threshold value range;

FIG. 15 a basic illustration of a measuring diagram for the evaluation of the position of the target object relative to a receiver device.

DETAILED DESCRIPTION

Figure 1:
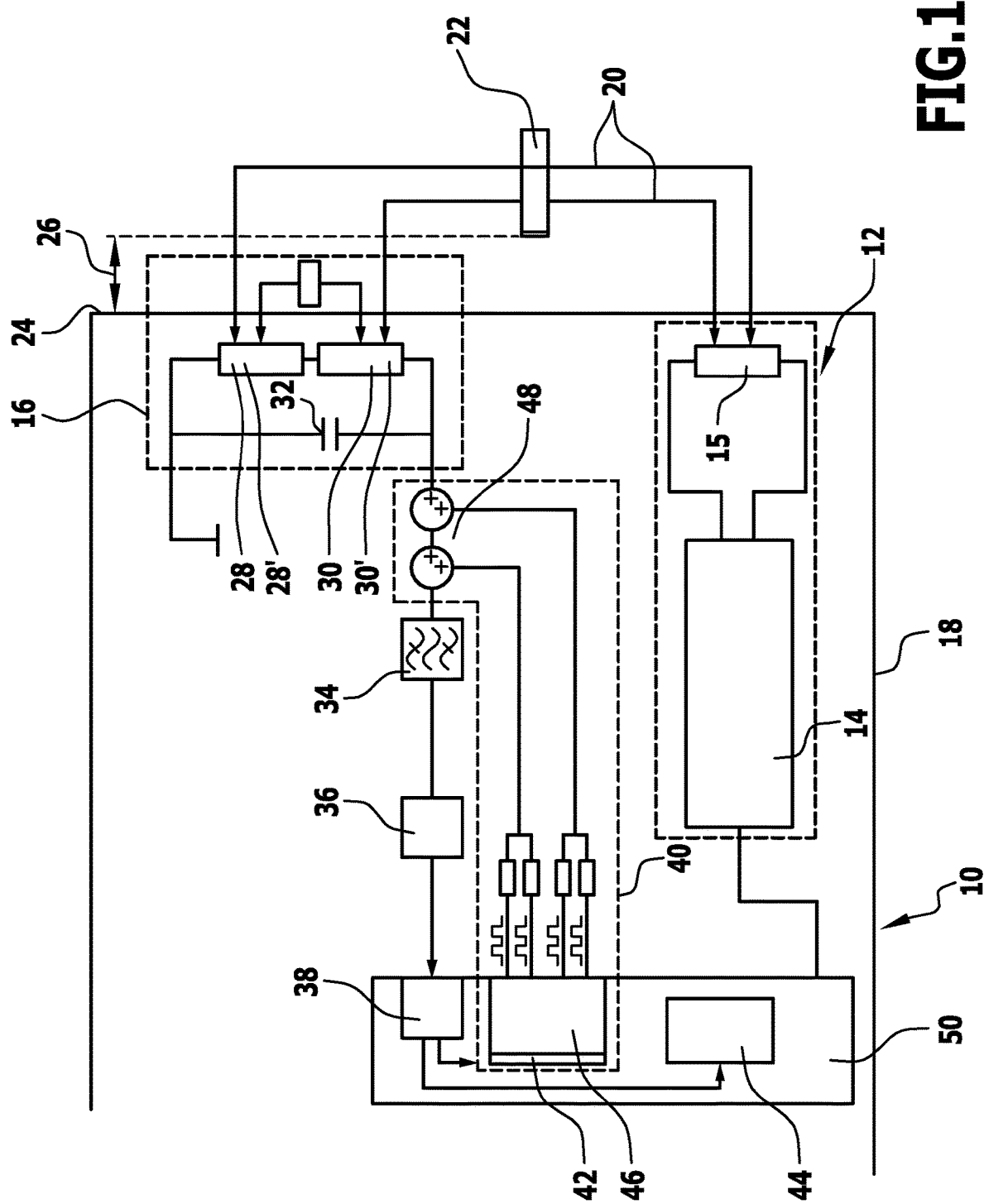
FIG. 1 shows a schematic illustration of an exemplary embodiment of a sensor apparatus in accordance with the invention.

An exemplary embodiment of a sensor apparatus in accordance with the invention which is shown schematically in FIG. 1 and is referenced 10 therein comprises a transmitter device 12. The transmitter device 12 is operated by periodic excitation signals having a basic frequency $f_0$.

In one exemplary embodiment, the transmitter device 12 comprises an a.c. source 14 which delivers an alternating current at the basic frequency $f_0$. This a.c. source 14 feeds a (transmission) coil 15.

Furthermore, the sensor apparatus 10 comprises a receiver device 16. The receiver device 16 is coupled to the transmitter device 12 in non-contact-making manner.

In particular, the transmitter device 12 and the receiver device 16 are arranged in a common housing 18 of the sensor apparatus 10.

Preferably the transmitter device 12 is positioned symmetrically with respect to the receiver device 16. (This symmetrical positioning is not shown in FIG. 1 for illustrative reasons.)

The coupling of the receiver device 16 to the transmitter device 12 is schematically indicated in FIG. 1 by the arrows with the reference symbol 20.

The sensor apparatus 10 serves for detecting a target object 22. The target object 22 is, in particular, mobile. Hereby, the target object 22 is positioned outside the housing 18. In principle, its position relative to the housing 18 and, for example, relative to an end face 24 of the housing 18 is variable. This positional variability is indicated in FIG. 1 by the double arrow with the reference symbol 26.

For example, the absolute position of the target object 22 with respect to the receiver device 16 (in particular, to the end face 24 of the housing 18) is detectable or a switching distance is generatable by the sensor apparatus 10; if, for example, a certain minimum spacing and/or a certain maximum spacing of the target object 22 to the end face 24 is detected, a corresponding switching signal is delivered.

In principle, the receiver device 16 delivers a (voltage) signal $$V = V_0 \sin(2\Pi f_0 + \varphi) \qquad (1)$$

which is periodic at the basic frequency $f_0$ but can be phase-shifted by the phase $\varphi$.

In one exemplary embodiment, the receiver device 16 is arranged and formed in such a way that, without any influence of a target object 22 (i.e. if the target object 22 is not present), the corresponding signal is at least approximately a zero-signal. It is thereby striven for the signal to be a zero-signal. It is however also possible in the case of a symmetrical arrangement of the transmitter device 12 relative to the receiver device 16 due to the installed situation thereof that the corresponding signal is only approximately a zero-signal. A compensation signal will then be generated and superimposed as will be explained hereinbelow in order to achieve a zero-signal to a good approximation without the influence of a target object 22.

In one exemplary embodiment, the receiver device 16 comprises a first part 28 and a second part 30. The first part 28 and the second part 30 are arranged and formed in such a way that a resulting signal which is the signal of the receiver device 16 is superimposed from signals of the first part 28 and the second part 30 and is thereby at least approximately a zero-signal if the target object 22 is not present. (The signal of the first part 28 and the signal of the second part 30 do not have to be signals actually measurable at the receiver device 16.)

In one exemplary embodiment, the first part 28 is formed by a first coil 28' and the second part 30 is formed by a second coil 30'. The first coil 28' and the second coil 30' are constructed in the same way with an equal number of turns but are wound in the opposite sense.

The coupling of the transmission coil 15 to the first coil 28' is $k_1$. The coupling of the transmission coil 15 to the second coil 30' is $k_2$. The coupling factors $k_1$ and $k_2$ can be affected in different ways by a metallic target object 22, whereby, even in the case of a balanced receiver device 16 when it delivers a zero-signal in the absence of the target object 22, there results a finite signal corresponding to the above signal in accordance with equation (1) in the presence of the target object 22. Due to the presence of the target object 22, the coupling factors $k_1$ and $k_2$ are affected in different manners. The alternating voltage in accordance with equation (1) decreases in the receiver device 16.

Provision may be made for one or more capacitors 32 to be connected in parallel with the series circuit of the first coil 28' and the second coil 30'.

In principle, the phase $\varphi$ and the amplitude $V_0$ of the signal which is delivered by the receiver device 16 depend on the material of the target object 22 and the spacing 26 to the target object 22 as well as on the geometrical details.

In the exemplary embodiment wherein the transmitter device 12 and the receiver device 16 comprise coils, the coupling between the transmitter device 12 and the receiver device 16 is an inductive coupling.

This inductive coupling is affected by the target object 22 in that the coupling factors $k_1$ and $k_2$, which are then inductive coupling factors, change and in particular, change unequally.

The target object 22 causes a detectable alteration in the inductance of the coils of the transmitter device 12 and the receiver device 16 or the loss resistance of the coils or the coil impedance or the coil quality factor is altered. Due to the particular construction of the receiver device 16, corresponding (asymmetrical) changes in the voltage in accordance with equation (1) become apparent.

A filter 34 is connected downstream of the receiver device 16. In particular, this filter 34 is in the form of a bandpass filter having a centre frequency $f_0$ and it preferably exhibits a high Q factor. Thus, in essence, only signals with the basic frequency $f_0$ are drawn upon for the evaluation process.

An amplifier 36 which amplifies corresponding input signals is connected downstream of the filter 34. The amplifier 36 is in the form of an operational amplifier for example.

The amplifier 36 provides its output signals to a signal evaluating device 38. The signal evaluating device 38 evaluates the signals delivered thereto in synchronism with the excitation signals of the transmitter device 12. This is explained in more detail hereinbelow.

A linking device 40 is associated with the signal evaluating device 38. The linking device 40 comprises a threshold value checking device 42. Signals of the signal evaluating device 38, i.e. delivered signals, or combinations of such evaluated signals, are delivered thereby to a threshold value checking device 42.

The latter checks whether the signals or signal combinations lie within a given threshold value range or not.

If it is detected that the evaluated signals or signal combinations lie within the threshold value range, they are delivered to a target object evaluation device 44. The target object evaluation device 44 can determine the position of the target object 22 relative to the receiver device 16 (and in particular to the end face 24).

If the check made by the threshold value checking device 42 shows that the evaluated signals or signal combinations which were delivered by the signal evaluating device 38 lie outside the threshold value range, then a signal generating device 46 generates overlay signals which are superimposed on the signals of the receiver device 16.

In particular, the linking device 40 comprises a logical interface 48 which is located between the filter 34 and the receiver device 16. Overlay signals generated by the signal generating device 46 are combined in this logical interface 48 with signals of the receiver device 16 and thereby superimposed thereon.

The signal generating device 46 produces the overlay signals in such a way that, after superimposition on the signal from the receiver device 16, signals or signal combinations are generated which, after evaluation by the signal evaluating device 38, lie within the threshold value range.

The threshold value range is in turn selected in such a way that, in all events, signals which form input signals for the amplifier 36 are amplified in a defined manner in the amplifier 36 i.e. that they lie within the amplification range of the amplifier 36 and in particular, do not lie in the saturation region of the amplifier 36.

The signal generating device 46 ensures that, in regard to its amplification properties, the amplifier 36 can be properly operated so that the amplifier 36 does not produce distorted signals, because for example, it has reached saturation.

The threshold value range is selected in such a way that a defined level of amplification is effected in the amplifier 36 without reaching saturation for (voltage) signals which lie within the threshold value range.

Hereby, it is taken into consideration during the process of evaluation by the target object evaluation device 44 in regard to the position of the target object 22 as to whether or not overlay signals were delivered.

In particular, an overlay signal consists in that a certain signal is extracted from the signal that was delivered by the receiver device 16, said certain signal being selected such that a shift into the threshold value range taken with respect to evaluated signals from the signal evaluating device 38 is possible.

This is explained in more detail hereinbelow on the basis of concrete exemplary embodiments.

In one embodiment, the sensor apparatus 10 comprises a microcontroller 50. In particular, the signal evaluating device 38, the threshold value checking device 42 and the target object evaluation device 44 are integrated into this microcontroller 50.

Furthermore, the signal generating device 46 of the linking device 40 and possibly too, parts of the transmitter device 12 can be integrated into this microcontroller 50. The microcontroller 50 also comprises the threshold value checking device 42.

Figure 2:
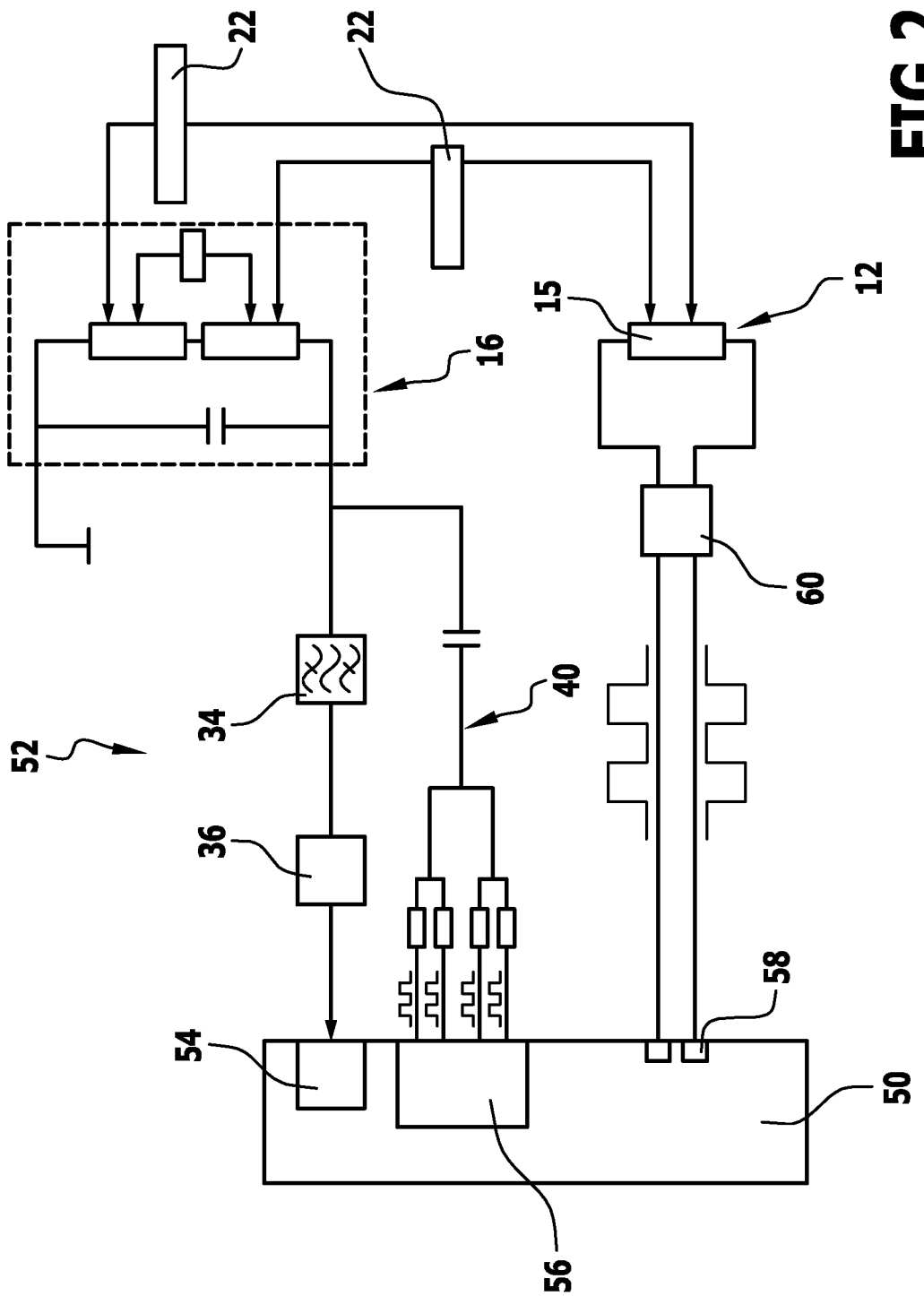
FIG. 2 an illustration similar to FIG. 1 with specific components.

A concrete implementation of the sensor apparatus 10 which is referenced 52 therein is shown schematically in FIG. 2. The same reference symbols are used for equivalent elements as in the sensor apparatus 10.

In the case of the sensor apparatus 52, the signal evaluating device 38 is formed by an analogue-digital converter 54 which is integrated into the microcontroller 50.

The signal generating device 46 of the linking device 40 is formed by a pulse width modulation device 56 which comprises, in particular, a plurality of pulse width modulators having different phase positions.

The linking device 40 produces from the digital signals of the pulse width modulation device 56 a corresponding analogue signal which is superimposed "phase-correctly" on the signal from the receiver device 16.

The transmitter device 12 itself is controlled by pulse width modulators 58 of the microcontroller 50.

For example, there are provided two pulse width modulators 58 in two lines which lead to the transmission coil 15.

An analogue switch device 60 which is positioned between the pulse width modulators 58 and the transmission coil 15 is provided. A corresponding signal with the basic frequency $f_0$ can then be produced by a complementary system of controlling the switch device 60 and thus the transmission coil 15.

Due to the pulse width modulators 58 which are operated at the frequency $f_0$, i.e. at the basic frequency, an evaluation process can be carried out in the signal evaluating device 38 in synchronism with the excitation signals of the transmitter device 12 in a simple manner. Furthermore, synchronized overlay signals can be generated.

Figure 3:
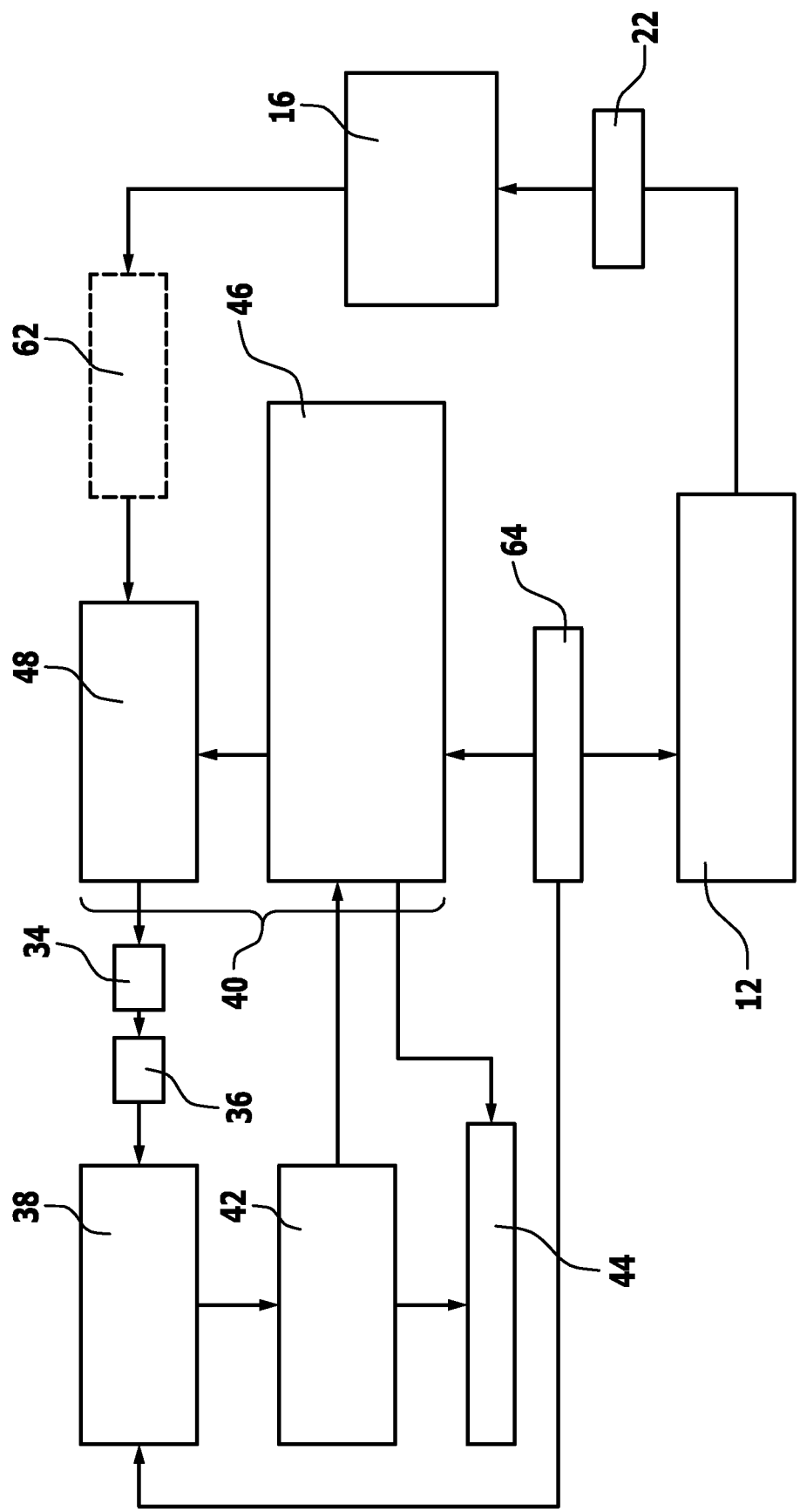
FIG. 3 a block diagram illustration of an exemplary embodiment of a sensor apparatus in accordance with the invention.

A schematic block diagram of a sensor apparatus in accordance with the invention is shown in FIG. 3. The same reference symbols as for equivalent elements in the sensor apparatus 10 are used.

The transmitter device 12 couples (in non-contact-making manner) to the receiver device 16, wherein this coupling is affected by the target object 22.

The receiver device 16 delivers signals which are supplied to the amplifier 36.

Hereby, provision may be made for the signals of the receiver device 16 to be processed by a processing device 62 before being supplied to the amplifier 36. For example, a filtering process is effected in order to obtain an evaluation for only signals at the basic frequency $f_0$. For example, a further amplifier (preamplifier) may also be provided or an impedance converter could be provided.

The amplifier 36, which is connected upstream of the filter 34, delivers its output signals to the signal evaluating device 38. Signals of the signal evaluating device 38 or signal combinations of such signals are checked by the threshold value checking device 42, namely, as to whether they lie within or outside the threshold value range.

Evaluated signals or signal combinations of such signals which originate from the signal evaluating device 38 and which lie within the threshold value range are delivered to the target object evaluation device 44.

If the check in the threshold value checking device 42 shows that the corresponding evaluated signals which are delivered by the signal evaluating device 38 or the signal combinations lie outside the threshold value range then the linking device 40 is controlled accordingly. Its signal generating device 46 generates overlay signals which are coupled-in in the logical interface 48.

It can thereby be ensured that the signals of the signal evaluating device 38 or signal combinations thereof lie within the threshold value range.

In the course of the target object evaluation process, it is taken into account as to whether overlay signals were generated. In principle, overlay signals could also be generated several times. In correspondence therewith, a count is also made as to the number of steps that were taken when generating the overlay signals. The signal generating device 46 is connected accordingly in signal conveying manner to the target object evaluation device 44 so that, for the concrete signals drawn upon for the target object evaluation process, the target object evaluation device 44 knows whether a shift into the threshold value range by means of overlay signals has taken place and possibly too, how many shifts have taken place.

Provision is made for a synchronizing system 64 which just ensures that the evaluation process in the signal evaluating device 38 occurs in synchronism with the excitation signals of the transmitter device 12. Furthermore, care is taken that the overlay signals which are generated by the signal generating device 46 are coupled-in in the logical interface 48 correspondingly synchronized.

In principle, it is also possible for a check to be made before the amplifier 36 as to whether the signal provided to the amplifier 36, which signal comes directly from the receiver device 16 or has passed through the processing device 62, lies within a threshold value range. If it should lie outside of this threshold value range, then an overlay signal is generated by the linking device 40 and is then superimposed on the signal so that the amplifier 36 only receives input signals which can be amplified within a normal amplification range, i.e. in particular, without saturation. In this case, a threshold value checking device would then be arranged before the amplifier 36.

The construction of the sensor apparatus 10 or 52 has the advantage that the threshold value checking device 42 can be integrated into the microcontroller 50 in a simple manner.

Due to the solution in accordance with the invention, the signal evaluating device 38 makes evaluable signals available. Zero-balancing of the evaluation signals does not take place and in particular, there is no zero-regulation process. Consequently, a finite regulating speed which could limit a maximum switching frequency of the sensor apparatus 10 does not apply here. Since a zero-regulation process does not take place, then a finite regulating speed that limits the switching frequency also does not arise.

Since a zero-regulation process does not take place, corresponding regulating variables also do not need to be generated. Consequently, there is no slowing down of the system due to a regulation process. Should the zero point regulation process be realized by a digital system, this would make heavy demands on its performance specifications. An accordingly needed microcontroller 50 exhibits a high power consumption, is relatively large and expensive.

Since a zero-regulation process does not take place, the basic problem arises that, in the case of a certain position of the target object 22 relative to the receiver device 16, the signal of the receiver device 16 can no longer be amplified since it lies outside a defined range of the amplifier.

In the case of the solution in accordance with the invention, this problem is solved by the provision of the linking device 40. Insofar as is necessary, an overlay signal 46 is generated by the signal generating device such as will ensure that the relevant signal (the evaluation signal of the signal evaluating device 38 in the exemplary embodiment in accordance with FIGS. 1 and 2) is shifted back into the threshold value range. From this, it results in turn that the signal occurring at the input of the amplifier 36 can then be amplified in a defined manner and saturation and the like are avoided. The problems described above do not then arise.

In the case of the solution in accordance with the invention, it is ultimately the absolute signals that are delivered by the signal evaluating device 38 or signal combinations of such signals which are evaluated, whereby at most, a shifting back into the threshold value range due to the overlay signals occurs if the threshold value range is exceeded.

The operation of the sensor apparatus 10 or 52 in accordance with the invention is described in the following on the basis of the diagrams in accord with FIGS. 4 to 16.

In one exemplary embodiment (FIG. 2), provision is made for the signal evaluating device 38 to be an analogue-digital converter 54.

Within one period of the signal of the receiver device 16 (FIG. 4 above), certain signal values (voltage values $V_1$, $V_2$, $V_3$ and $V_4$) are detected at the analogue-digital converter 54. These differ in phase. $V_1$ is detected at the phase $\delta+0°$, $V_2$ at the phase $\delta+90°$, $V_3$ at the phase $\delta+180°$ and $V_4$ at the phase $\delta+270°$. This is depicted schematically in FIG. 4.

Hereby, $\delta$ is a shift value which is selected such that a possible crosstalk of flanks in the transmitter signal cannot be coupled-in.

From the known signal values $V_1$, $V_2$, $V_3$, $V_4$ (which are signals delivered by the signal evaluating device 38), the differences delta_X=$V_1$−$V_3$ and delta_Y=$V_2$−$V_4$ are formed; these are signal combinations of evaluated signals. To a certain extent, delta_X indicates a cosine component in the signal and, to a certain extent, delta_Y indicates a sine component in the signal.

Figure 5:
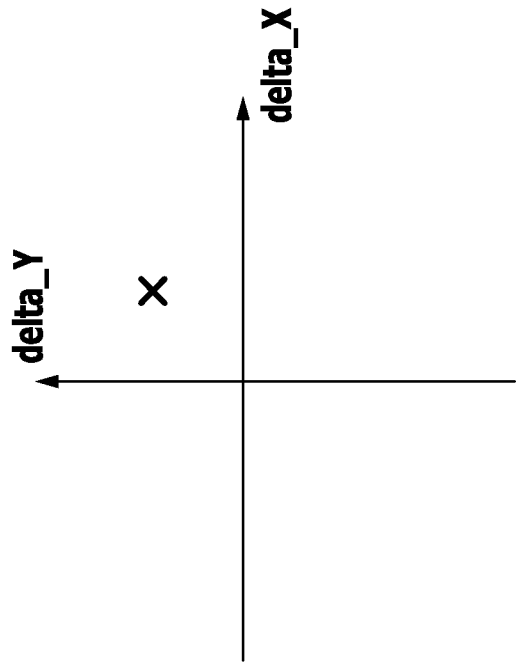
FIG. 5 a schematic illustration for items of data (signal combinations) which are determined from the signal values in accordance with FIG. 4 and which characterize a relative position of the target object.
Figure 4:
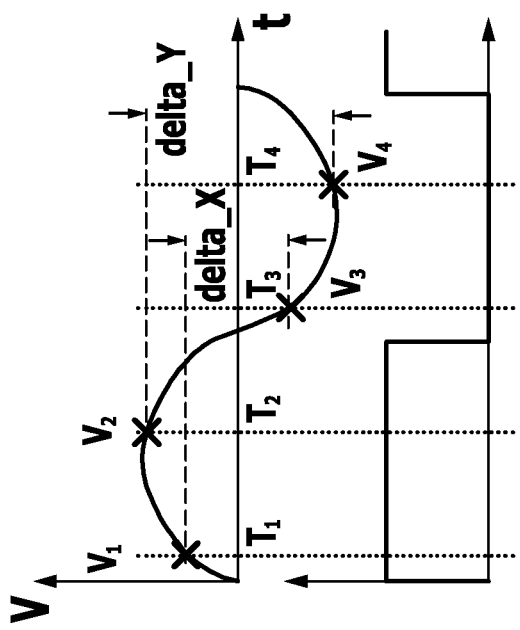
FIG. 4 a schematic illustration for signal values determined during a signal evaluating process.

A diagram is shown in FIG. 5 in which an example of a determined delta_X and a determined delta_Y value is drawn in a corresponding plane. In principle, the position of the target object 22 relative to the housing 18 can then be determined therefrom by the target object evaluation device 44.

Figure 6C:
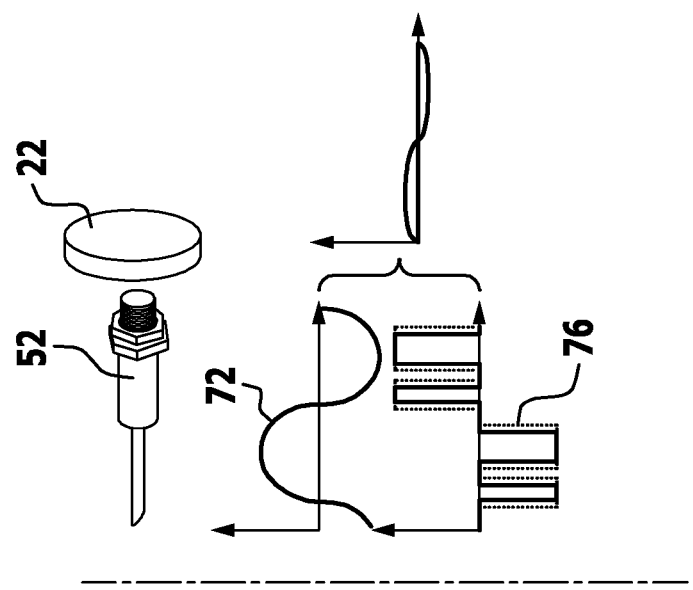
FIG. 6 (a) schematically, an evaluation signal in analogue form and a compensation signal when no target object is present.
Figure 6B:
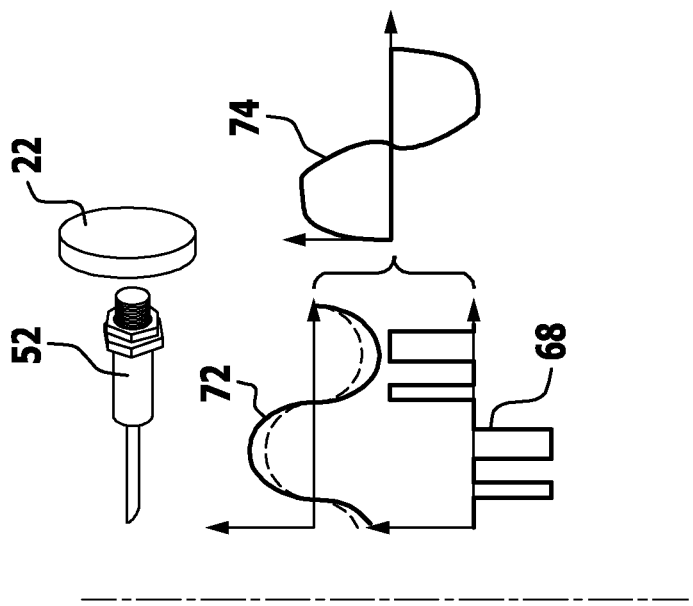
Figure 6A:
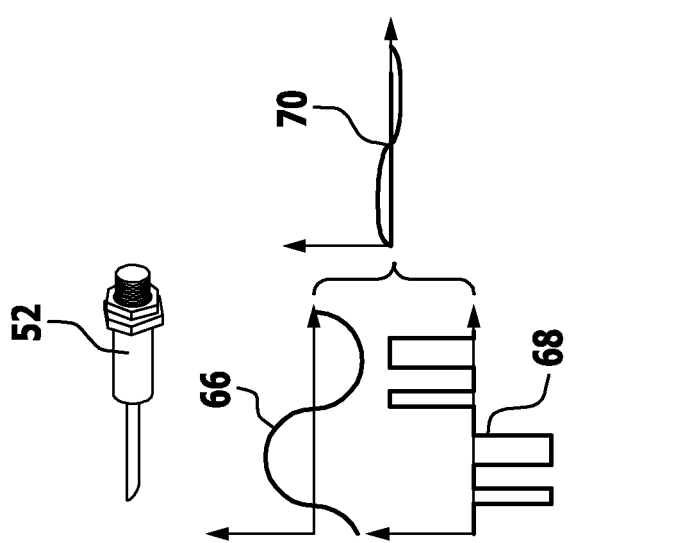

A signal 66 of the receiver device 16 for the exemplary case of a transmitter apparatus 52 without a target object is depicted in FIG. 6 (*a*). In principle, this signal should be a zero-signal in the case of an ideal receiver device 16 and an ideal arrangement. However, due to the influence of the housing 18 for example, the signal 66 is only approximately a zero-signal.

The signal generating device 46 delivers a compensation signal 68 which is then superimposed on the signal 66. In one exemplary embodiment, the compensation signal 68 is selected such that there then results the signal 70 which is a zero-signal.

The compensation signal 68 is not an overlay signal which, for example, returns the evaluation signal of the signal evaluating device 38 to the threshold value range.

The compensation signal 68 is always superimposed on signals of the receiver device 16 in order to produce, in effect, an at least approximately zero-signal 70.

It is in principle sufficient for the compensation signal 68 to be selected such that the delta_X value and the delta_Y value lie in the threshold value range 86 without the influence of a target object 22. A zero-compensation process is advantageous, but not necessary.

In this sense, the signals of the receiver device 16 which are delivered to the filter 34 and in particular then to the amplifier 36 are already derived from direct signals of the receiver device 16, namely, the compensation signal 68 is superimposed so that for example, without the influence of the target object 22, the threshold value range 86 is not exceeded and the "at least approximately" zero-signal 70 is obtained.

In FIG. 6 (*b*), there are shown the corresponding signals in the event of the influence of a target object 22. This results in a signal 72 from the receiver device 16. When compensated with the compensation signal 68, adjusted and amplified, the signal 74 then results. It is apparent from the signal 74, that the amplifier 36 has already gone into saturation. Accordingly, the threshold value range was exceeded.

In FIG. 6 (*c*), there is shown for the same situation 52 a situation in which both the compensation signal 68 and the overlay signal 76 have been superimposed on the signal 72. This results in the signal 78 which is adjusted and amplified and is drawn upon for the evaluation process in the target object evaluation device.

Thus, by means of the solution in accordance with the invention, the overlay signal 76 is then superimposed, if necessary, in addition to the compensation signal 68 (which serves for the zero-signal generating process) in order to shift the evaluation signals of the signal evaluating device 38 into the threshold value range if they lie outside it so as, in turn, to obtain a defined level of amplification in the amplifier 36 without the amplifier 36 going into saturation. Thus, a measurement of the signal from the receiver device 16 is made possible even for such a spacing of the target object 22 to the housing 18, whereas, without the overlay signal 76, a measurement would no longer be possible.

This method is described once more with the aid of FIGS. 7 to 16.

In FIG. 7 (*a*), there is shown an unprocessed input signal 80 to the signal evaluating device 38 without the presence of the target object 22. A first compensation signal 68 is superimposed in the logical interface 48 and this results in the signal 82 (FIG. 7 (*b*)) which is compensated and amplified. (If the compensation were exact, the signal 82 would be a zero-signal.)

In FIG. 7 (*c*), the location of the corresponding values which are signal combinations of the signals evaluated by the signal evaluating device 38 is shown exemplarily in the delta_X and the delta_Y plane.

Figure 8A:
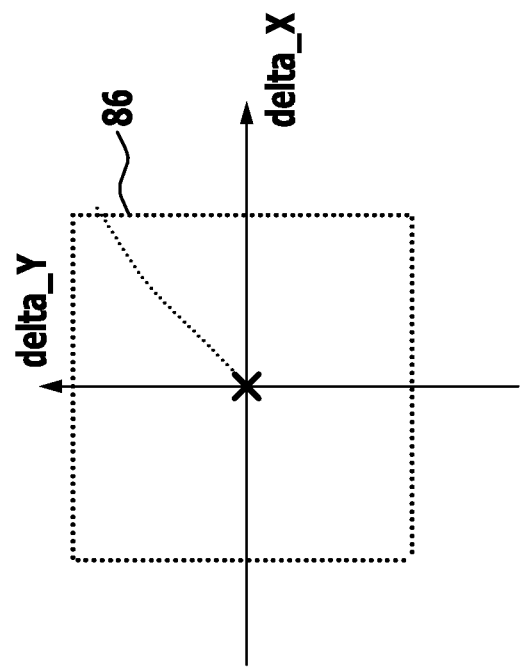
FIGS. 8 (a), (b), (c) the situation as in FIGS. 7 (a) to (c) if a zero point compensation process were carried out.
Figure 8B:
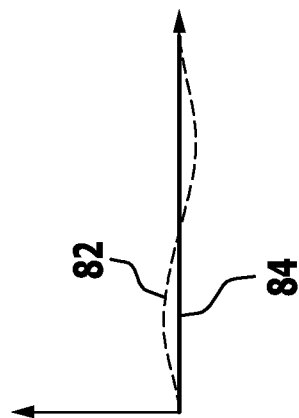
Figure 8C:
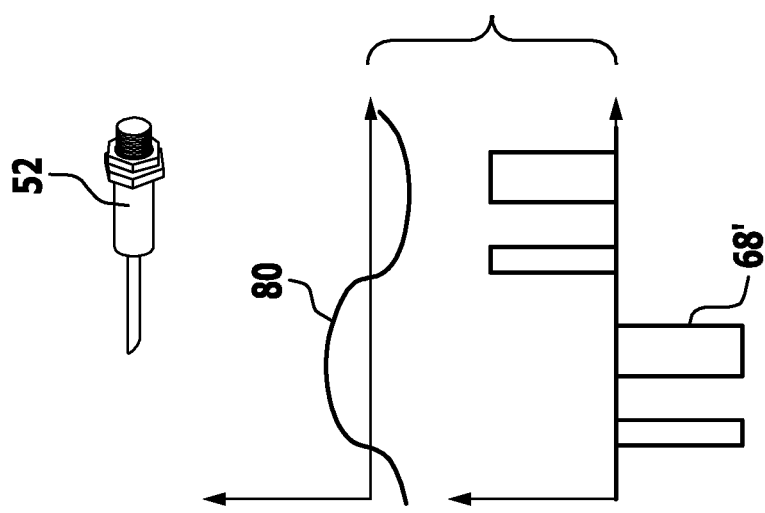

In FIGS. 8 (*a*) to (*c*), the same situation as in FIGS. 7 (*a*) to (*c*) is shown wherein, in this case, another, a second compensation signal 68' has been added and the zero-signal 84 is obtained. delta_X and delta_Y then lie at zero and this indicates precisely the absence of the target object 22.

Thus, an exemplary case is show in FIG. 7 in which the first compensation signal 68 is taken into consideration and, in FIG. 8, the case is shown in which a still more effective second compensation signal 68' is generated and taken into consideration. This then results in improved measuring accuracy for the target object detection process.

In FIG. 9, the situation is then shown as the target object 22 approaches. This results in the signal 84 from the receiver device 16. The corresponding adjusted and amplified signal (with compensation by the compensation signal 68 or 68') is the signal 86 (FIG. 9 (*b*)). Corresponding delta_X and delta_Y values lie within the threshold value range 86 which is indicated in FIG. 9 (*c*) by the corresponding square (other shapes of the corresponding edging are also possible).

Since the corresponding difference values lie within the threshold value range 86, an overlay signal does not have to be generated and taken into consideration.

Figure 10A:
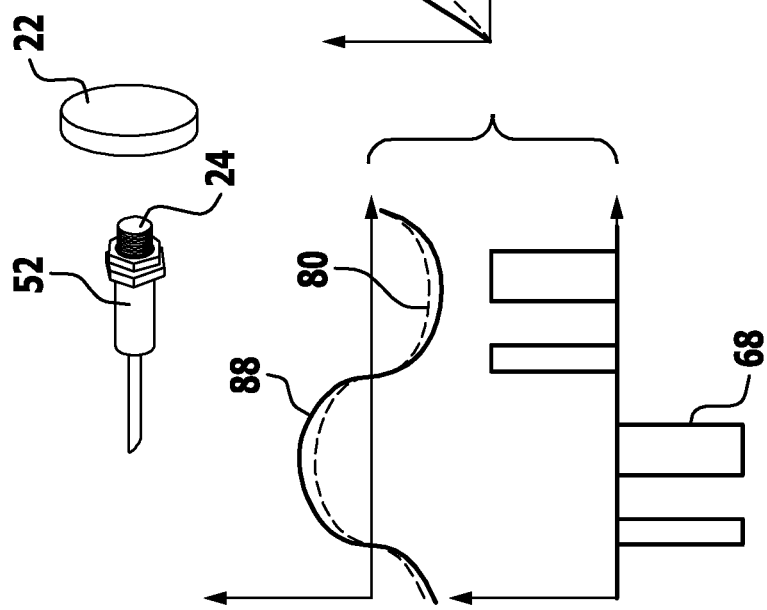
FIGS. 10 (a), (b), (c) the same situation as in FIGS. 9 (a) to (c), when the target object is closer to the receiver device.
Figure 10B:
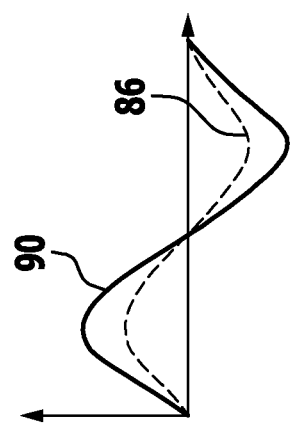
Figure 10C:
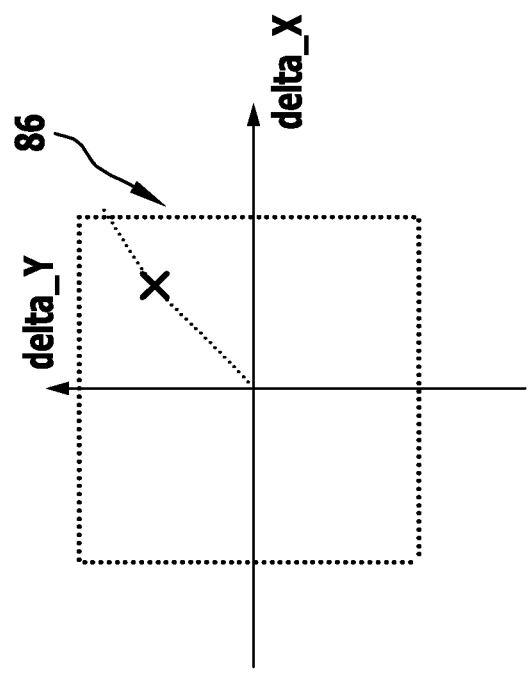
Figure 16:
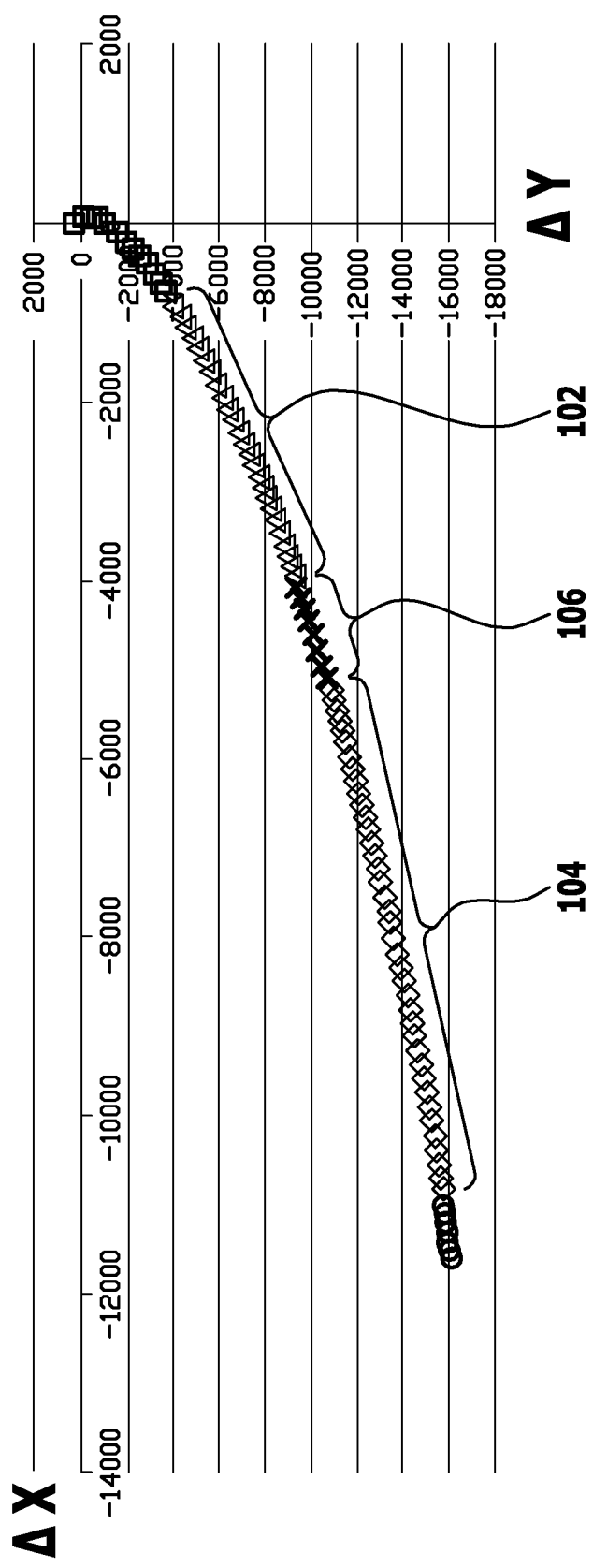
FIG. 16 a modified measuring diagram which was obtained from the data in accordance with FIG. 16, wherein a shifting process into the threshold value range has been taken into account.

In FIG. 10, there is shown a case at another point of approach of the target object 22. This results in the signal 88 which, after the adjusting and amplifying (and compensating) processes, then results in the signal 90 (FIG. 10 (*b*)). This signal 90 is passed on to the signal evaluating device 38.

The resulting values for delta_X and delta_Y are indicated in FIG. 10 (*c*). They lie within the threshold value range 86 so that an overlay signal does not have to be generated in this case.

Closer approach of the target object 22 to the end face 24 is illustrated in FIG. 11. The corresponding signal from the receiver device 16 is then referenced by 92. After amplification (and adjustment and compensation), there results the signal 94. The location relative to the threshold value range 86 of the values delta_X and delta_Y is shown in FIG. 11 (*c*). The threshold value range 86 is exceeded.

This is detected by the threshold value checking device 42. It then generates an overlay signal 96 (FIG. 12 (*a*)) which is coupled-in accordingly in the logical interface 48. As the outcome thereof, this results in an amplified signal 98 (FIG. 12 (*b*)) which leads on to the corresponding values that have been drawn upon for the evaluation process again lying within the threshold value range 86 (FIG. 12 (*c*)). Hereby, it is taken into account during the target object evaluation process in particular that the overlay signal 96 was subtracted. In particular, the overlay signal 96 is a fixed signal which is selected such that the process of shifting back into the threshold value range 86 is achieved.

In principle hereby, it can happen that the overlay signal 96 has to be adapted and superimposed several times i.e. that the pulse width must be increased several times by the overlay signal 96 in order to succeed in the process of shifting back into the threshold value range 86.

In FIG. 13, a case is shown of a further example wherein the threshold value range 86 is exceeded with respect to delta_Y. The corresponding signal from the receiver device 16 is referenced 93. In addition to the overlay signal 96, a further overlay signal 100 (FIG. 14 (*a*)) is then superimposed in order to obtain evaluable signals within the threshold value range 86 (FIG. 14 (*c*)). The resulting signal is designated by 97 in FIG. 14 (*b*). The signal before the superimposition process (but after the compensation process) is designated by 95 in FIG. 13 (*b*). By using suitable overlay signals the effect is achieved that evaluable signals lie in the threshold value range 86 with respect to both delta_X and delta_Y.

The corresponding values for a real measurement are again shown in FIG. 15 wherein the threshold value range 86 is shown. The measurement value ranges 102, 104 and 106 are based on the fact that a shift back into the threshold value range 86 has occurred. The corresponding delta_X and delta_Y values result from overlay signals having been superimposed just once or several times.

The target object evaluation device 44 takes this into consideration. In dependence on how often a shift has been effected, the corresponding measurement values are positioned correctly. This results in the reconstructed curve in accordance with FIG. 16. The outcome thereof is that there ensues a dynamic extension of the measurement range wherein no zero point regulation process has been effected, but nevertheless it is ensured that the analogue-digital converter 54 and the amplifier 36 are not driven into saturation.

Even if the spacing of the target object 22 to the end face 24 falls below a certain distance in which the amplifier 36 or the analogue-digital converter 54 would otherwise go into saturation, a spacing measurement can continue to be carried out. The linking device 40 acts on the signal delivered by the receiver device 16 in such a way that the resulting signal strength is reduced and the amplifier 36 works within its defined range, i.e. saturation is prevented.

In the case of the exemplary embodiment described above, this is carried out for both the "in phase component" of the corresponding signal ($V_2$ and $V_4$ or delta_Y) and/or for the "out of phase component" of the corresponding signal ($V_1$ and $V_3$ or delta_X). A combination with regard to amplitude and phase is thus possible. The dynamic measuring range of the sensor apparatus 10 or 52 can be extended, whereby a high resolution is retained, in particular, when an analogue-digital converter 54 is used for the signal evaluating device 38. A high degree of amplification of the input voltage to the amplifier 36 is possible.

The principle can be used not only for inductive sensor arrangements.

In the sensor apparatus 10, the sensitive elements of the receiver device 16 are the coils 28', 30'. The sensitive elements could also be capacitors or Hall elements for example.

The linking device 40 may comprise a subtracting, an adding or else a capacitive coupling device.

The signal evaluating device 38 may comprise an analogue-digital converter 54 or else comparators.

The target object evaluation device 44 can be a microcontroller or also an analogue computer.

In the example described above, the signal generating device 46 comprises four pulse width modulators 58 corresponding to the phase positions 0°, 180° and 90°, 270°. It is in principle also possible for just two pulse width modulators or a direct digital synthesiser (DDS) for example to be provided. A digital-analogue converter for producing corresponding signals or a programmable amplifier (PGA) including a phase-shifter could also be provided.

LIST OF REFERENCE SYMBOLS 10 sensor apparatus
12 transmitter device
14 a.c. source
15 transmission coil
16 receiver device
18 housing
20 coupling
22 target object
24 end face
26 position variability
28 first part
28' first coil
30 second part
30' second coil
32 capacitor
34 filter
36 amplifier
38 signal evaluating device
40 linking device
42 threshold value checking device
44 target object evaluation device
46 signal generating device
48 logical interface
50 microcontroller
52 sensor apparatus
54 analogue-digital converter
56 pulse width modulator device
58 pulse width modulator
60 analogue switch device
62 processing device
64 synchronization system
66 signal
68 first compensation signal
68' second compensation signal
70 zero-signal
72 signal
74 signal
76 overlay signal
78 signal
80 signal
82 signal
84 signal
86 threshold value range
88 signal
90 signal
92 signal
93 signal
94 signal
95 signal
96 overlay signal
97 signal
100 overlay signal
102 measured value
104 measured value
106 measured value

What is claimed is:

1. Sensor apparatus for detecting a target object, comprising:
a transmitter device which is operated by periodic excitation signals at a basic frequency,
a receiver device which couples to the transmitter device, wherein the coupling is dependent on a relative position of the target object with respect to the receiver device, wherein the receiver device delivers signals at the basic frequency which are dependent on the relative position of the target object with respect to the receiver device,
an amplifier which is connected downstream of the receiver device,
a signal evaluating device which is connected downstream of the amplifier, which evaluates the signals delivered thereto in synchronism with the excitation signals of the transmitter device, and which provides evaluated signals,
a threshold value checking device which checks (i) whether evaluated signals delivered by the signal evaluating device or signal combinations of such evaluated signals lie within or outside a threshold value range, or (ii) whether signals delivered to the amplifier lie within or outside a threshold value range, wherein the threshold value range is selected in such a way that the signal evaluating device or amplifier is not operated in a saturation region thereof, and
a linking device which acts on signals from the receiver device or signals derived therefrom in such a way that evaluated signals or signal combinations of such evaluated signals delivered by the signal evaluating device are shifted into the threshold value range insofar as they previously lay outside it, or the signals delivered to the amplifier are shifted into the threshold value range insofar as they previously lay outside it, wherein the linking device generates overlay signals which are superimposed on signals of the receiver device or signals derived therefrom, wherein the overlay signals are selected in such a way that the evaluated signals or signal combinations thereof are modified to lie within the threshold value range or signals supplied to the amplifier are modified to lie within the threshold value range.

2. A sensor apparatus in accordance with claim 1, wherein the receiver device is formed such that it delivers an at least approximately zero-signal without the influence of the target object.

3. A sensor apparatus in accordance with claim 1, wherein the linking device adds at least one of compensation signals and overlay signals to the signals of the receiver device or signals derived therefrom in order to cause a shift into the threshold value range.

4. A sensor apparatus in accordance with claim 1, wherein the threshold value range is a voltage range.

5. A sensor apparatus in accordance with claim 1, wherein the linking device subtracts a certain voltage level from signals of the receiver device or signals derived therefrom.

6. A sensor apparatus in accordance with claim 1, wherein the threshold value range is selected in such a way that the amplifier works in a defined amplification mode for input signals of the amplifier.

7. A sensor apparatus in accordance with claim 1, wherein the signal evaluating device is or comprises at least one of an analogue-digital converter and a comparator.

8. A sensor apparatus in accordance with claim 7, wherein the threshold value range is selected in such a way that the analogue-digital converter or the comparator works in a defined converter mode or comparator mode for input signals of the analogue-digital converter or the comparator.

9. A sensor apparatus in accordance with claim 1, further comprising a filter for the basic frequency which is arranged between the signal evaluating device and the receiver device.

10. A sensor apparatus in accordance with claim 1, wherein the signal evaluating device determines certain signal values in synchronism with the excitation signals.

11. A sensor apparatus in accordance with claim 10, wherein certain signal values determined by the signal evaluating device within one or more periods differ in phase, wherein, in particular, at least two successive signal values are determined: a signal value $V_1$ at the phase position $\delta+0°$, a signal value $V_2$ at the phase position $\delta+90°$, a signal value V3 at the phase position $\delta+180°$ and a signal value $V_4$ at the phase position $\delta+270°$, wherein $\delta$ is a shift value.

12. A sensor apparatus in accordance with claim 10, further comprising a target object evaluation device which evaluates signal values of the signal evaluating device for determining the relative position of the target object, wherein, in particular, the target object evaluation device evaluates differences of signal values, wherein, in particular, the differences delta_$X=V_1-V_3$ and delta_$Y=V_2-V_4$ are formed.

13. A sensor apparatus in accordance with claim 12, wherein differences formed by the target object evaluation device are evaluated without zero-regulation.

14. A sensor apparatus in accordance with claim 12, wherein the target object evaluation device takes into consideration signals from the linking device during the target object evaluation process.

15. A sensor apparatus in accordance with claim 1, wherein the linking device comprises a signal generating device which delivers the overlay signals that are combined with signals of the receiver device or signals derived therefrom.

16. A sensor apparatus in accordance with claim 15, wherein the overlay signals are generated in synchronism with the excitation signals.

17. A sensor apparatus in accordance with claim 15, wherein the signal generating device is or comprises a pulse width modulation device.

18. A sensor apparatus in accordance with claim 17, wherein the pulse width modulation device comprises respective pulse width modulators which are provided for different phase positions.

19. A sensor apparatus in accordance with claim 1, wherein the transmitter device is arranged symmetrically with respect to the receiver device.

20. A sensor apparatus in accordance with claim 1, wherein the receiver device comprises a first part and a second part, wherein at least one of (i) the first part is arranged, and (ii) the first part is formed anti-symmetrically with respect to the second part and signals of the receiver device are formed by the superimposition of signals of the first part and the second part.

21. A sensor apparatus in accordance with claim 1, wherein the transmitter device comprises at least one coil.

22. A sensor apparatus in accordance with claim 1, wherein the receiver device comprises at least a first coil and a second coil.

23. A sensor apparatus in accordance with claim 1, wherein the receiver device is coupled inductively to the transmitter device and in that the target object is formed of a metallic material.

24. A sensor apparatus in accordance with claim 1, wherein the linking device delivers compensation signals which bring signals of the receiver device or signals derived therefrom into the threshold value range without the influence of the target object.

25. A sensor apparatus in accordance with claim 1, being in the form of a proximity sensing apparatus by means of which at least one of (i) the spacing of the target object to the receiver device, (ii) an approach of the target object to the receiver device, and (iii) a distancing of the target object from the receiver device is detectable.

26. Method for operating a sensor apparatus for detecting a target object, comprising:

operating a transmitter device by periodic excitation signals at a certain basic frequency, evaluating of signals of a receiver device which exhibit the basic frequency, wherein the receiver device couples to the transmitter device and the coupling and thus too the signals of the receiver device are dependent on a relative position of the target object with respect to the receiver device, amplifying signals of the receiver device or signals derived therefrom and evaluating these signals in synchronism with the excitation signal such that evaluated signals are provided, making a check as to whether (i) the evaluated signals or signal combination thereof or whether (ii) signals supplied to an amplifier for amplification purposes do or do not lie within a threshold value range, wherein the threshold value range is selected in such a way that a signal evaluating device providing the evaluated signals or an amplifier amplifying signals is not operated in a saturation region thereof, and, if it is detected that the evaluated signals or a signal combination thereof lie outside of the threshold value range, or if it is detected that the signals supplied to the amplifier lie outside of the threshold value range then overlay signals are generated which are superimposed on signals of the receiver device or signals derived therefrom, wherein the overlay signals are selected in such a way that the evaluated signals or signal combinations thereof are modified to lie within the threshold value range or signals supplied to the amplifier are modified to lie within the threshold value range.

27. A method in accordance with claim 26, wherein the evaluated signals or the signal combinations of such signals which lie within the threshold value range are used for determining the position of the target object relative to the receiver device, wherein a determination is made as to whether and how often a shift into the threshold value range by the superimposition process has occurred.

28. A method in accordance with claim 27, wherein the target object determination process is carried out without zero-regulation of the evaluated signals.

29. A method in accordance with claim 26, wherein compensation signals are superimposed on signals from the receiver device or signals derived therefrom, wherein said compensation signals are selected in such a way that signals supplied as input signals to a signal evaluating device or to the amplifier for the purposes of amplification lie within the threshold value range without the influence of the target object.

* * * * *